(12) United States Patent
Xiao et al.

(10) Patent No.: US 8,404,507 B2
(45) Date of Patent: Mar. 26, 2013

(54) TFT-LCD ARRAY SUBSTRATE AND MANUFACTURING METHOD THEREOF

(75) Inventors: Hongxi Xiao, Beijing (CN); Jae Yun Jung, Beijing (CN); Zuhong Liu, Beijing (CN); Taek Ho Hong, Beijing (CN); Jeong Hun Rhee, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 414 days.

(21) Appl. No.: 12/490,472

(22) Filed: Jun. 24, 2009

(65) Prior Publication Data
US 2009/0321740 A1    Dec. 31, 2009

(30) Foreign Application Priority Data
Jun. 25, 2008    (CN) .......................... 2008 1 0115595

(51) Int. Cl.
*H01L 21/00*    (2006.01)
(52) U.S. Cl. .... 438/38; 257/250; 257/330; 257/E21.002
(58) Field of Classification Search .................... 438/38; 257/E21.002, 250, 330
See application file for complete search history.

(56) References Cited

U.S. PATENT DOCUMENTS
2007/0058112 A1* 3/2007 Li et al. .......................... 349/106
2007/0278487 A1* 12/2007 Choung et al. .................. 257/59

FOREIGN PATENT DOCUMENTS
| CN | 1612344 A | 5/2005 |
| CN | 1707343 A | 12/2005 |
| CN | 1987622 A | 6/2007 |

* cited by examiner

*Primary Examiner* — Eugene Lee
*Assistant Examiner* — Elias M Ullah
(74) *Attorney, Agent, or Firm* — Ladas & Parry LLP

(57) ABSTRACT

A TFT-LCD array substrate and a manufacturing method thereof. The array substrate comprises a gate line, a data line, and a pixel electrode, and the pixel electrode is disposed in a pixel region defined by the intersection between the gate line and the data line. In the pixel region, a partition groove for forming a pixel electrode pattern is provided at the periphery of the pixel electrode. This structure is helpful to form a pixel electrode pattern by a lift-off process, which significantly reduces the production cost and improves the production yield.

7 Claims, 5 Drawing Sheets

B - B

TFT-LCD ARRAY SUBSTRATE AND MANUFACTURING METHOD THEREOF

BACKGROUND

Embodiments of the present invention relate to a thin film transistor-liquid crystal display array substrate and a manufacturing method thereof.

Thin film transistor liquid crystal displays (TFT-LCDs) possess advantages of small volume, low power consumption, low radiation, etc., and are gradually prevailing in the market of flat plate displays. As for a TFT-LCD, an array substrate and the manufacturing method thereof dominate to a large extent performance, yield, and price of the final products.

In order to efficiently reduce the production cost of TFT-LCDs and improve yield, the manufacturing process of a TFT-LCD array substrate is gradually simplified. Such manufacturing process has been evolving from an initial 7-mask process to a current 4-mask process based on half tone or gray tone photolithography technology. Besides, a 3-Mask process is under research and development.

One 3-Mask process has been proposed in Chinese patent application CN 200510132423.X, in which a gate line and a gate electrode are formed through a patterning process with a first normal mask; a data line, a source electrode, a drain electrode, and a thin film transistor (TFT) channel region are then formed through a patterning process with a second graytone mask; and a pixel electrode is finally formed through a patterning process with a third normal mask. In this method, the third patterning process forms a transparent pixel electrode directly contacting with the surface of the drain electrode in a common manner, the sidewalls of the photoresist pattern that is subject to exposure and development have a vertical shape after photolithography, and the sidewalls of the passivation layer have an inwardly concaved shape with over-etching during etching process, so that the transparent conductive thin film to be deposited subsequently is disconnected at the sidewalls of the passivation layer. However, in practice, such a process requires applying a relatively thick photoresist layer to make the slope of the photoresist edge as steep as possible and close to 90 degree. Unfortunately, such measure practically cannot appropriately disconnect the transparent conductive thin film at the photoresist edges. In this case, the cost increases, and the quality of a lift-off process cannot be ensured. As for the TFT-LCD array substrate in preparation, any adhesion of the transparent conductive thin film results in residual, which brings great harm to the lift-off process and gives rise to defects to be overcome of the 3-Mask process.

SUMMARY OF THE INVENTION

An embodiment of the present invention provides a thin film transistor liquid crystal display (TFT-LCD) array substrate. The array substrate comprises a gate line, a data line, and a pixel electrode. The pixel electrode is disposed in a pixel region defined by the intersection between the gate line and the data line. In the pixel region, a partition groove for forming a pixel electrode pattern is provided at the periphery of the pixel electrode.

An embodiment of the present invention provides a method for manufacturing a TFT-LCD array substrate, comprising:

step 1 of depositing a layer of gate metal thin film on a substrate and patterning the gate metal thin film to form a pattern including a gate line and a gate electrode;

step 2 of depositing sequentially a gate insulating layer, a semiconductor layer, a doped semiconductor layer, and a layer of source/drain metal thin film on the substrate after step 1, and patterning the layers to form patterns including a data line, a source electrode, a drain electrode, and a thin film transistor (TFT) channel region; and step 3 of depositing a passivation layer on the substrate after step 2, then patterning the passivation layer to form patterns including a passivation layer via hole and a partition groove, retaining the photoresist used in the patterning process, then depositing a transparent conductive thin film, and forming a pixel electrode pattern through a lift-off process, wherein a partition groove is formed at the periphery of the pixel electrode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE EMBODIMENTS

Figure 1:
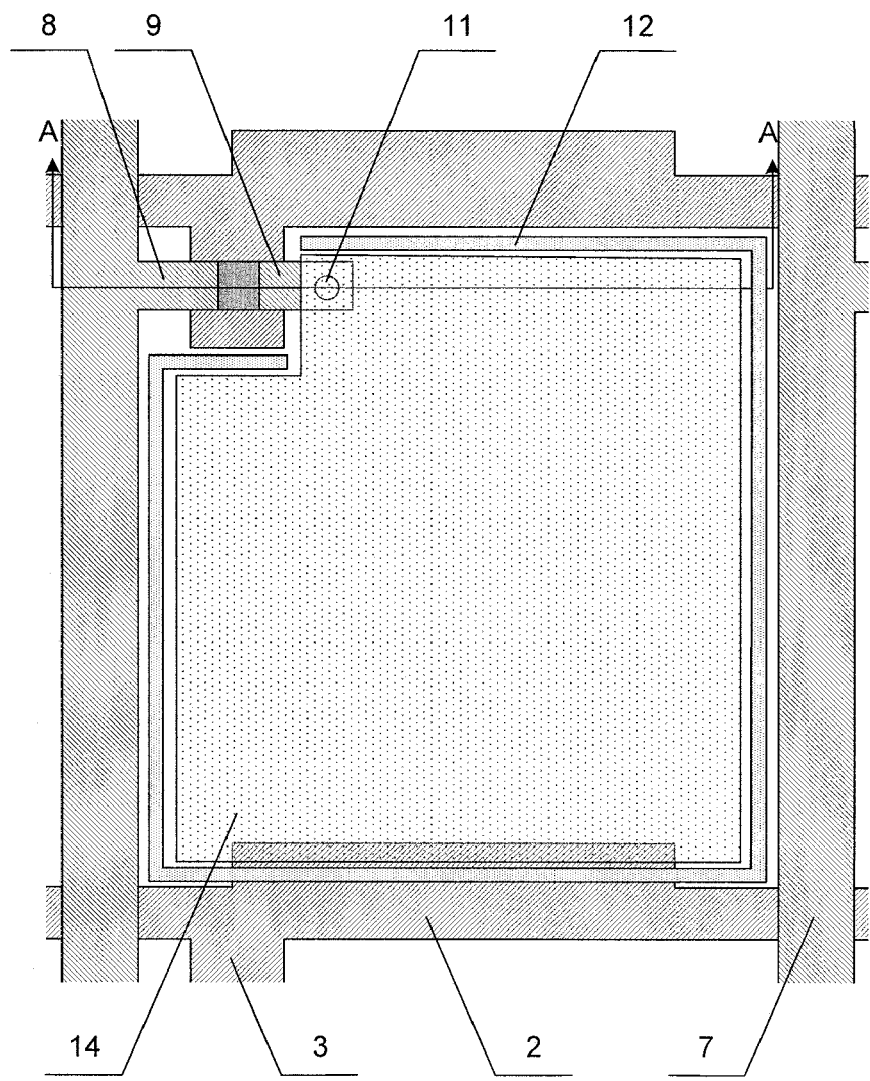
FIG. 1 is a structural view showing a TFT-LCD array substrate according to a first embodiment of the present invention.
Figure 2:
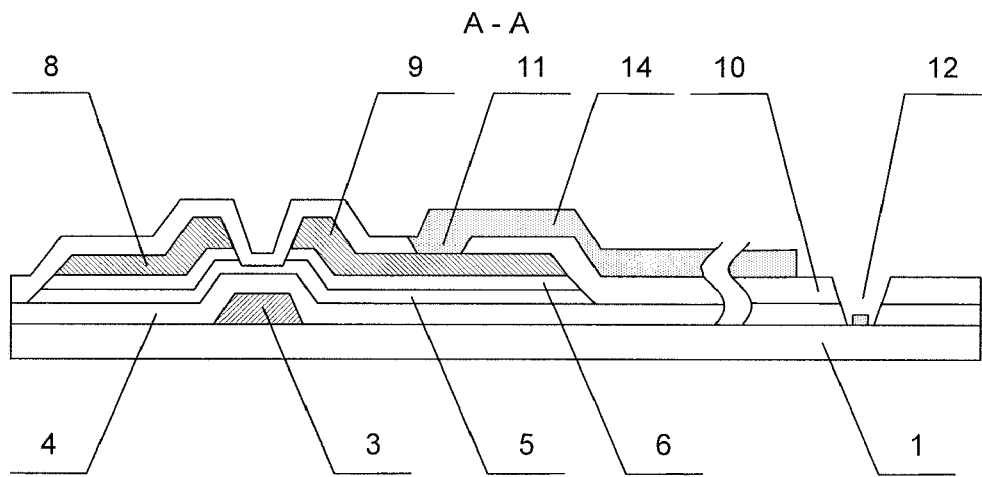
FIG. 2 is a cross-sectional view along the line A-A in FIG. 1.

FIG. 1 is a structural view showing a TFT-LCD array substrate according to a first embodiment of the present invention, and FIG. 2 is a cross-sectional view along the line A-A in FIG. 1. As shown in FIGS. 1 and 2, the TFT-LCD array substrate in the present embodiment comprises a gate line 2 and a data line 7 on a substrate 1, and the gate line 2 and the data line 7 intersect with each other at a right angle, defining a pixel region. A thin film transistor (TFT) is formed at the intersection region, and a pixel electrode 14 is formed in the pixel region. The TFT comprises: a gate electrode 3 that is formed on the substrate 1; a gate insulating layer 4 that is formed on the gate electrode 3 and covers the whole substrate 1; a semiconductor layer 5 and a doped semiconductor layer 6 that are sequentially formed on the gate insulating layer 4 and provided over the gate electrode 3; the source electrode 8 and the drain electrode 9 that are provided on the doped semiconductor layer 6; a TFT channel region that is between the source electrode 8 and the drain electrode 9; and a passivation layer 10 that is formed on the source electrode 8 and the drain electrode 9. A passivation layer via hole 11 is formed within the passivation layer 10 at a position over the drain electrode 9, and the pixel electrode 14 is connected with the drain electrode 9 via the passivation layer via hole 11. In addition, the gate electrode 3 is connected with the gate line 2, and the source electrode 8 is connected with the data line 7. The doped semiconductor layer 6 functions as an ohmic contact layer. In the present embodiment, a slit 12 that functions as a partition groove is formed in the pixel region. The slit 12 is located at the periphery of the pixel electrode 14 and surrounds the pixel electrode 14 except the portion that is connected with the drain electrode 9. Preferably, the width of the slit 12 is in the range of about 1 μm~about 30 μm. On the substrate, there may be a plurality of gate lines and a plurality of data lines that intersect with each other to define a plurality of pixel regions.

FIGS. 3~10 are schematic views showing the manufacturing process of a TFT-LCD array substrate according to an embodiment of the invention. In the related field, the so-called patterning process comprises steps of photoresist applying a photoresist layer, masking, exposing and developing the photoresist layer, etching the underlying layer, and lifting-off the remained photoresist layer. In the embodiment, a positive photoresist is used as an example, but the invention is not limited to any illustrative example. For example, a negative photoresist can also be employed.

Figure 3:
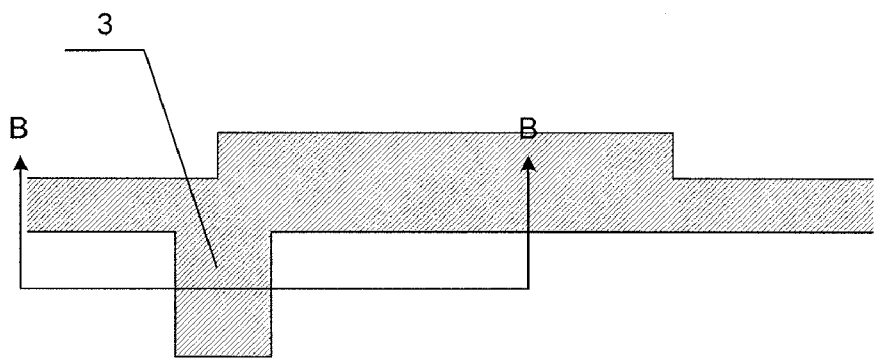
FIG. 3 is a plan view showing a TFT-LCD array substrate after a first patterning process.
Figure 3:
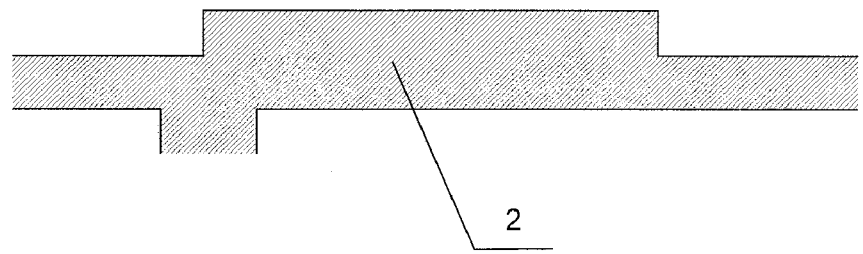
Figure 4:
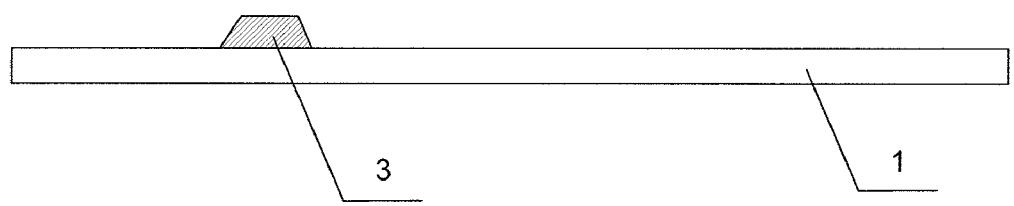
FIG. 4 is a cross-sectional view along the line B-B in FIG. 3.

FIG. 3 is a plan view showing a TFT-LCD array substrate after a first patterning process, and FIG. 4 is a cross-sectional view along the line B-B in FIG. 3. Through magnetron sputtering, thermal evaporation, or other film forming method, a layer of gate metal thin film is deposited on the substrate 1 (e.g., a glass substrate or a quartz substrate). The gate metal thin film can be a single layer film of one material selected from the group consisting of Mo, Al, AlNd alloy, W, Cr, and Cu, or a multilayer film of any combination of these metals. The first patterning process is performed on the gate metal thin film with a normal mask to form the patterns of gate lines 2 and gate electrodes 3 on the substrate 1. The gate lines 2 are parallel with each other, as shown in FIGS. 3 and 4. In the embodiment, a configuration that a storage capacitor is only formed on a gate line (Cs on Gate) is illustrated as an example. In another embodiment, a storage capacitor can be formed on a common electrode line (Cs on Common), and the common electrode lines can be formed simultaneously with the gate lines, and such common electrode lines can be parallel with the gate lines. Actually, it is also possible that no storage capacitors are formed.

Figure 5:
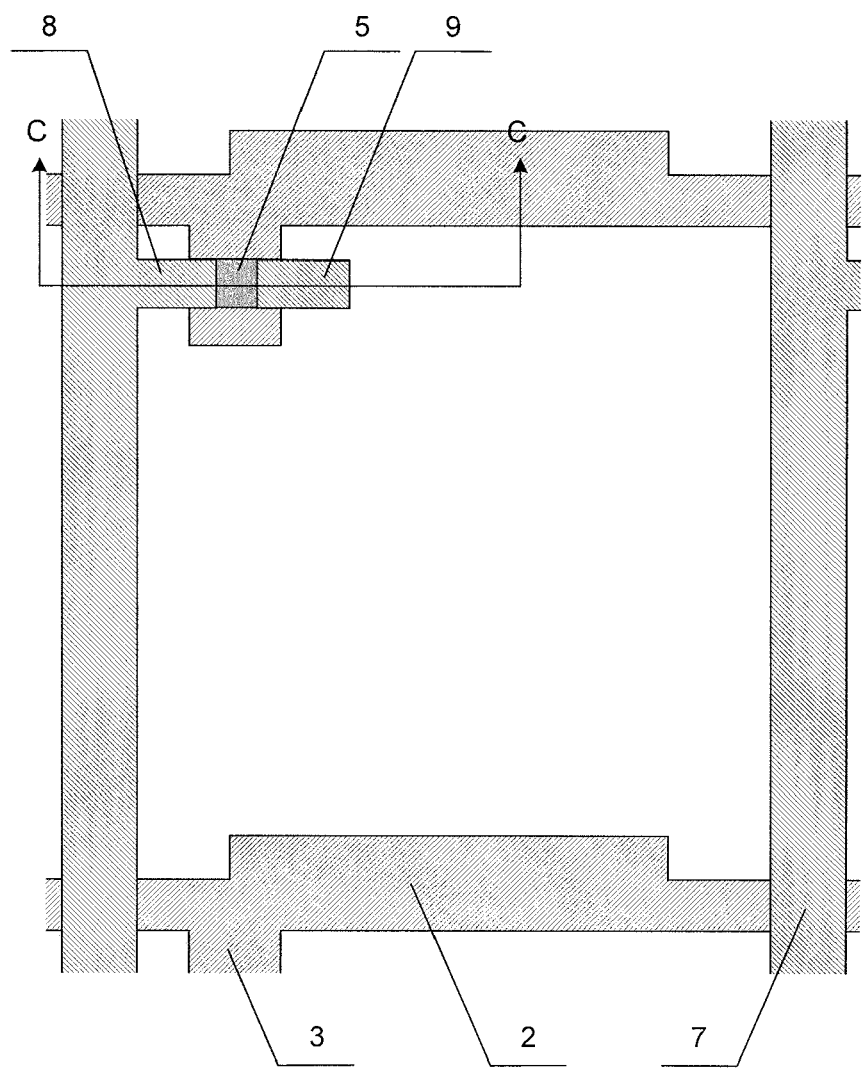
FIG. 5 is a plan view showing a TFT-LCD array substrate after a second patterning process.
Figure 6:
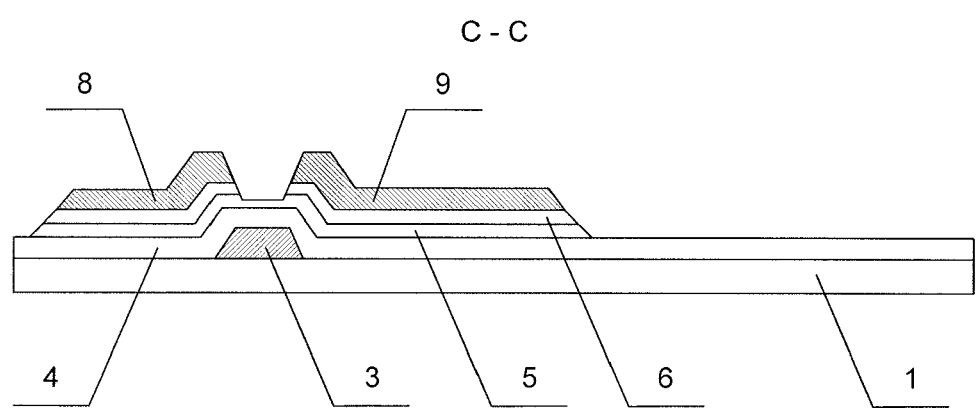
FIG. 6 is a cross-sectional view along the line C-C in FIG. 5.

FIG. 5 is a plan view showing the TFT-LCD array substrate after a second patterning process, and FIG. 6 is a cross-sectional view along the line C-C in FIG. 5. On the substrate 1 on which the patterns for the gate lines and gate electrodes has been formed, through chemical vapor deposition or other film forming methods, a gate insulating layer 4, a semiconductor layer 5, and a doped semiconductor layer (ohmic contact layer) 6 are sequentially deposited. The semiconductor layer 5 and the doped semiconductor layer 6 constitute an active layer. Then, through magnetron sputtering, thermal evaporation, or other film forming methods, a layer of source/drain metal thin film is deposited on the substrate 1. The source/drain metal thin film can be a single layer film of one material selected from the group consisting of Mo, Al, AlNd alloy, W, Cr, and Cu, or a multilayer film constituted by any combination of these metals. By performing the second patterning process on the semiconductor layer with a half-tone mask or a gray-tone mask, the doped semiconductor layer 6 and the source/drain metal thin film are patterned, to form patterns for data lines 7, source electrodes 8, drain electrodes 9, and the TFT channel regions on the substrate 1, and a pattern (e.g., an island) for the active layer on the gate electrode 3. The doped semiconductor layer 6 between the source electrode 8 and the drain electrode 9 is completely etched off to expose the underlying semiconductor layer 5, while the other region exposes the underlying gate insulating layer, as shown in FIGS. 5 and 6. For example, the process described above in which a half-tone mask or a gray-tone mask is used to form the patterns for the data lines, the source electrodes, the drain electrodes, and the TFT channel regions has been widely used in the current 4-Mask process.

Figure 7:
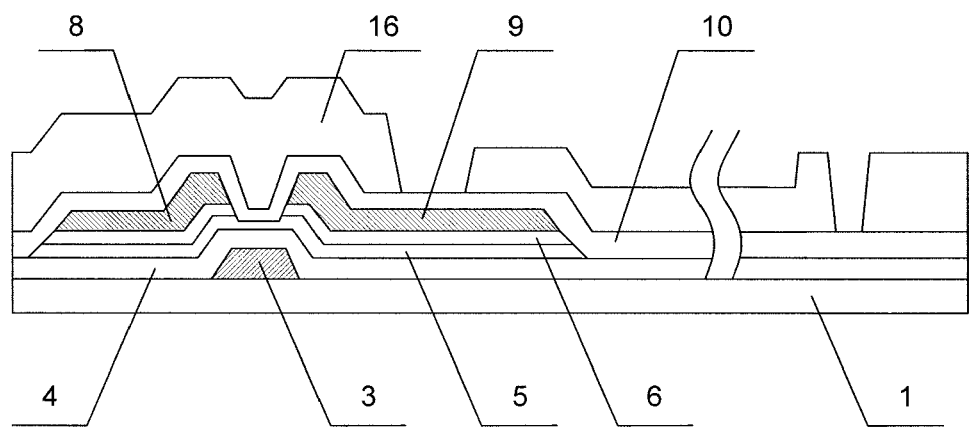
FIG. 7 is a schematic view showing a TFT-LCD array substrate after an exposing and developing process for photoresist during a third patterning process.

FIG. 7 is a schematic view showing the TFT-LCD array substrate after the exposing and developing process for photoresist during a third patterning process. Through chemical vapor deposition or other film forming method, a passivation layer 10 is deposited on the substrate 1 on which the above patterns have been formed, then a photoresist layer 16 is applied over the passivation layer 10, and an exposure is performed on the photoresist layer with a half-tone mask or a gray-tone mask, so that the photoresist layer is formed into a completely exposed region, a partially exposed region and an un-exposed region. On the substrate 1, the region where the passivation layer via hole over the drain electrode and where the slit is formed at the pixel electrode periphery corresponds to a completely exposed region, the region where the pixel electrode is formed corresponds to a partially exposed region, and the remaining region corresponds to un-exposed regions. After development of the photoresist layer, the photoresist layer in the completely exposed region (i.e., the photoresist completely removed region) is completely removed; the photoresist in the partially exposed region (i.e., the photoresist partially remained region) is partially removed and reduced in thickness; and the photoresist in the un-exposed region (i.e., the photoresist fully remained region) retains the largest thickness. In this case, the applied photoresist layer 16 can have a thickness of about 2 μm or larger, because the photoresist layer of such a thickness can maintain a photoresist thickness of about 1 μm or larger after the subsequent ashing process, as shown in FIG. 7.

Figure 8:
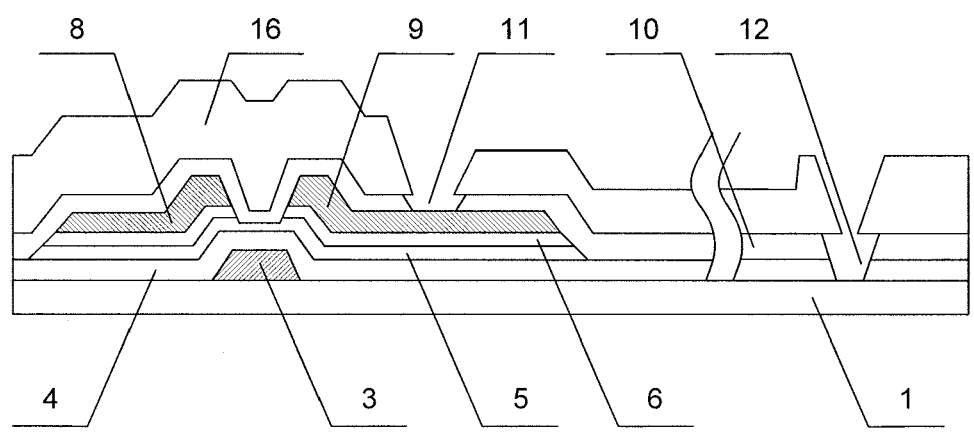
FIG. 8 is a schematic view showing a TFT-LCD array substrate after an etching process during the third patterning process.

FIG. 8 is a schematic view showing the TFT-LCD array substrate after the etching process during the third patterning process. Through a dry etching in which chemical reactions dominate, an etching is performed on the passivation layer 10 at the position where the passivation layer via hole is located, so as to form a passivation layer via hole 11 over the drain electrode. Also, an etching is performed on the passivation layer 10 and the gate insulating layer 4 at the pixel electrode periphery, so as to form a slit 12 around the pixel electrode and have the passivation layer 10 and the gate insulating layer 4 in the slit 12 be subject to a significant lateral etching. The width of the slit 12 can be about 1 μm~about 30 μm, as shown in FIG. 8. The conditions for the dry etching include a radio frequency power (RF power) of about 1000 W~about 5000 W, and a pressure of about 0.0665 mbar about 0.399 mbar (about 50 mTorr~about 300 mTorr) in a reaction gas containing fluorine-based gas of about 10 vol. %~about 50 vol. %. These conditions for the dry etching can render the rate, at which the gate insulating layer in the slit retreats laterally, much higher than that of the photoresist layer, so that the passivation layer and the gate insulating layer are subject to a significant lateral etching. In this case, increasing the reaction pressure and maintaining the percentage of the fluorine-containing gas are helpful to produce a dry etching dominated by chemical reactions, while decreasing the RF power can reduce the ion impact so as to make the etching rate mainly dominated by the isotropic chemical reaction.

Figure 9:
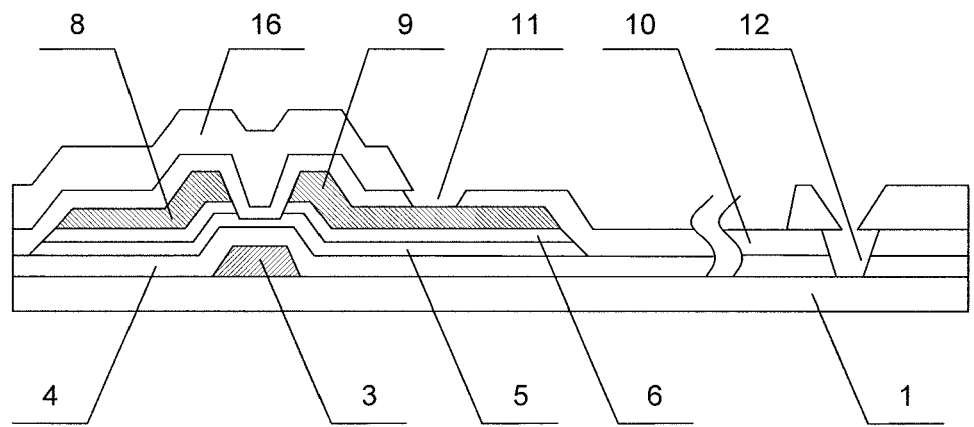
FIG. 9 is a schematic view showing a TFT-LCD array substrate after an ashing process during the third patterning process.

FIG. 9 is a schematic view showing the TFT-LCD array substrate after an ashing process during the third patterning process. By the ashing process, the photoresist layer in the partially exposed region is completely removed, the photoresist in the un-exposed region is partially removed and reduced in thickness but still has a thickness of about 1 μm or larger. By the dry etching and ashing process described above, the photoresist edge at the slit forms a suspended undercut, as shown in FIG. 9.

Figure 10:
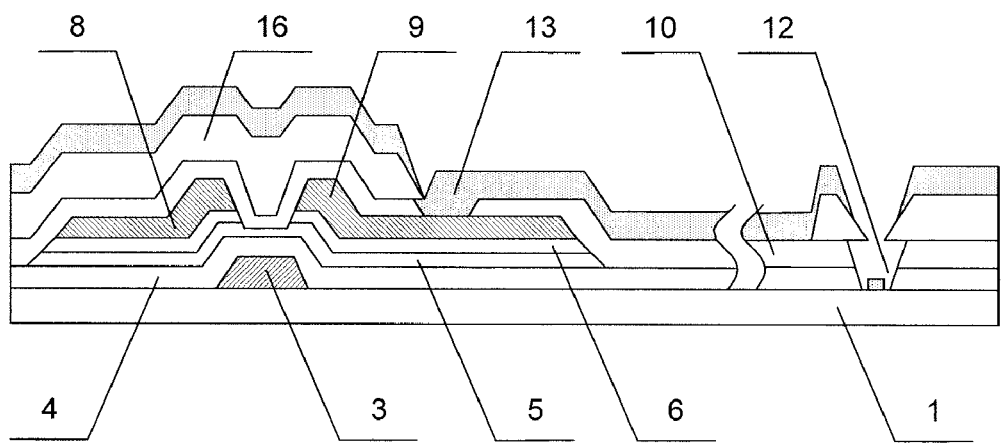
FIG. 10 is a schematic view showing a TFT-LCD array substrate after deposition of the transparent conductive thin film during the third patterning process.

FIG. 10 is a schematic view showing the TFT-LCD array substrate after deposition of a transparent conductive thin film during the third patterning process, and is a cross-sectional view corresponding to that along the line A-A in FIG. 1. Through magnetron sputtering, thermal evaporation or other film forming methods, a transparent conductive thin film 13 is deposited on the substrate on which the above patterns has been formed, and the transparent conductive thin film 13 can be indium tin oxide (ITO), indium zinc oxide (IZO) and the like. At the slit 12, due to the suspended undercut at the photoresist edge, the transparent conductive thin film deposited in the slit 12 has a small thickness, and the transparent conductive thin film 13 is disconnected at the edge of the slit 12. That is, the transparent conductive thin film 13 in the slit 12 is not connected with the transparent conductive thin film 13 at either side of the slit 12, which will not affect the integrity of the pixel electrode pattern. Furthermore, a portion of the photoresist is uncovered at the section of the edge of the slit 12, which provides a good basis for the subsequent lift-off process, as shown in FIG. 10. The concept of disconnecting the transparent conductive thin film at the slit described above is different from that used in the conventional method.

In the end, by removing the remaining photoresist layer with a lift-off process, the transparent conductive thin film attached to the photoresist is lift off along with photoresist layer with chemicals, so that a pattern of the pixel electrode 14 is left on the substrate. The pixel electrode 14 is connected with the drain electrode 9 via the passivation layer via hole 11, and only a little transparent conductive thin film remains at the bottom of the slit 12 at the periphery of the pixel electrode 14, as shown in FIGS. 1 and 2.

Figure 11:
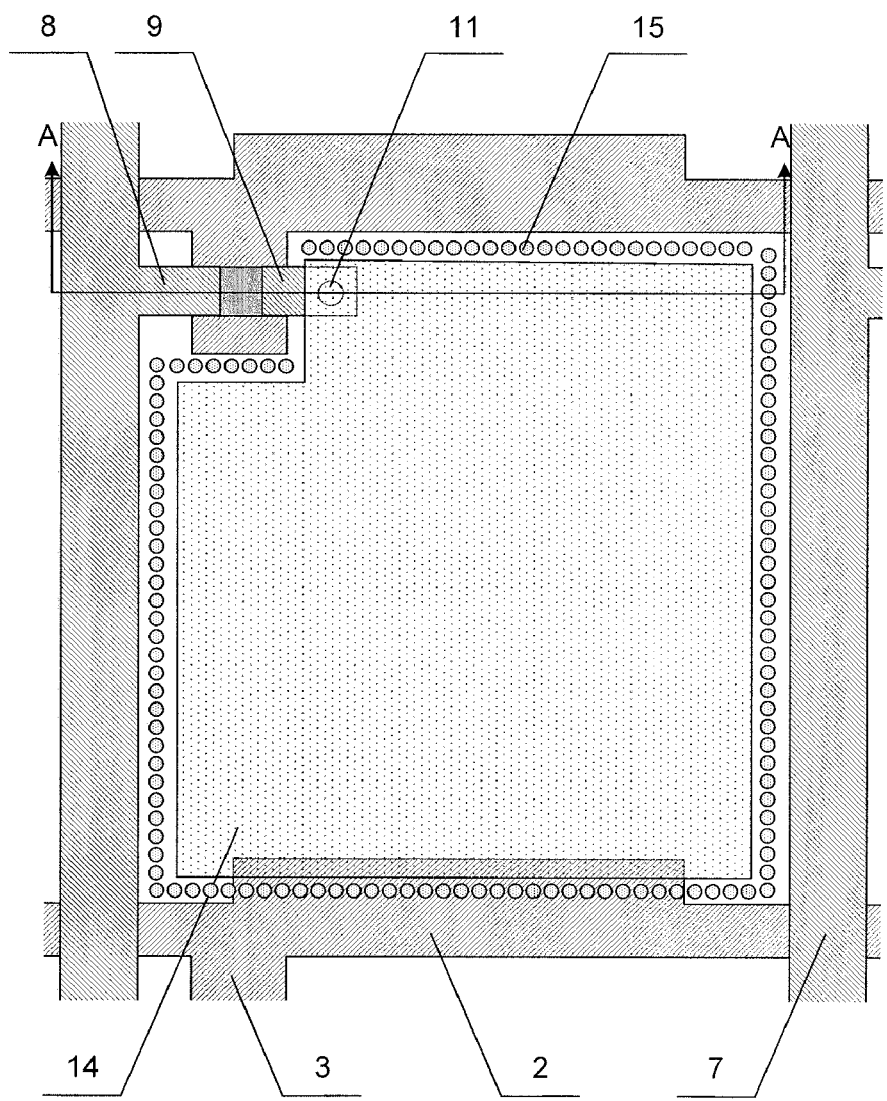
FIG. 11 is a structural view showing a TFT-LCD array substrate according to a second embodiment of the present invention.

FIG. 11 is a structural view showing a TFT-LCD array substrate according to a second embodiment of the present invention. The main structure for the TFT-LCD array substrate in the present embodiment is substantially identical with that of the first embodiment, and the differences include that a plurality of through holes 15, which function as a partition groove, are formed in the pixel region. The plurality of through holes 15 are arranged in a line along the periphery of the pixel electrode 14. The adjacent through holes are separated by a space from each other, and these through holes form a through hole set to surround the pixel electrode 14 except the portion connected to the drain electrode. The lateral cross-sectional shape of the through holes 15 can be circular, elliptical, rectangular, or other suitable shapes. Preferably, when the through holes are circular, the diameter is about 1 μm~about 30 μm. Obviously, instead of a slit or through holes, the partition groove can take other shape or form. The distance between the through holes 15 can be determined as desired.

In the embodiment described above, there is provided a TFT-LCD array substrate in which partition grooves surrounding the pixel electrodes are disposed in the pixel regions. The array substrate is subject to three patterning processes to form the TFT-LCD array substrate. By means of the partition grooves in combination with the dry etching in which chemical reactions dominate, the passivation layer and the gate insulating layer within the partition grooves are subject to significant lateral etching, and the photoresist edges at the partition grooves form a suspended undercut, which ensures the quality of the lift-off process and the integrity of the pixel electrode. In contrast to the convention method in which an inwardly concaved structure is formed at the edge of the passivation layer and the photoresist edge forms a vertical shape, a suspended undercut is formed at the photoresist edge in the embodiments of the present invention, the transparent conductive thin film is completely disconnected at the photoresist edge to avoid the adhesion of the transparent conductive thin film and improve the product quality.

Below is a flow chart showing a method for manufacturing a TFT-LCD array substrate of the present invention, which comprises:

step 1 of depositing a layer of gate metal thin film on a substrate and forming a pattern including a gate line and a gate electrode by a first patterning process;

step 2 of depositing sequentially a gate insulating layer, a semiconductor layer, a doped semiconductor layer, and a layer of source/drain metal thin film on the substrate after step 1, and forming patterns including a data line, a source electrode, a drain electrode, and a TFT channel region; and step 3 of depositing a passivation layer on the substrate after step 2, forming patterns including a passivation layer via hole and a partition groove, retaining the photoresist used in the patterning process, then depositing a transparent conductive thin film, and forming a pixel electrode pattern by a lift-off process.

Through magnetron sputtering, thermal evaporation or other film forming methods, the gate metal thin film is deposited on the substrate 1 (e.g., a glass substrate or a quartz substrate). The gate metal thin film can be a single layer film of one material selected from the group consisting of Mo, Al, AlNd alloy, W, Cr, and Cu, or a multilayer film of any combination of these metals. The first patterning process is performed on the gate metal thin film with a normal mask to form the pattern of the gate line and the gate electrode on the substrate.

On the substrate on which the pattern for the gate line and gate electrode has been formed, firstly, through chemical vapor deposition or other film forming methods, a gate insulating layer, a semiconductor layer, and a doped semiconductor layer (ohmic contact layer) are sequentially deposited. The semiconductor layer and the doped semiconductor layer together constitute an active layer. Then, through magnetron sputtering, thermal evaporation or other film forming methods, a layer of source/drain metal thin film is deposited. The source/drain metal thin film can be a single layer film of one material selected from the group consisting of Mo, Al, AlNd alloy, W, Cr, and Cu, or a multilayer film of any combination of these metals. By performing the second patterning process on the semiconductor layer, the doped semiconductor layer, and the source/drain metal thin film with a half-tone mask or a gray-tone mask, patterns for the data line, the source electrode, the drain electrode, and the TFT channel region is formed on the substrate, and for example an island pattern for the active layer is formed on the gate electrode. The doped semiconductor layer between the source electrode and the drain electrode is completely etched off to expose the underlying semiconductor layer, while the other regions expose the underlying gate insulating layer.

Below is a flow chart showing the formation of pixel electrode pattern in the method for manufacturing a TFT-LCD array substrate of the embodiment, which comprises:

step 31 of depositing a passivation layer on the substrate after step 2;

step 32 of applying a photoresist layer on the passivation layer;

step 33 of performing exposing and developing the photoresist layer with a half-tone mask or a gray-tone mask to form a photoresist fully remained region, a photoresist partially remained region, and a photoresist completely removed region;

step 34 of forming a passivation layer via hole and a partition groove by a dry etching, and having the passivation layer and the gate insulating layer in the partition groove be subject to a lateral etching;

step 35 of completely removing the photoresist layer in the photoresist partially remained region by an ashing process, so that the photoresist edge at the position of the partition groove forms a suspended undercut;

step 36 of depositing a transparent conductive thin film;

step 37 of removing the remained photoresist layer by a lift-off process along with the transparent conductive thin film on the photoresist layer so that a pixel electrode pattern is formed, and the pixel electrode is connected with the drain electrode via the passivation layer via hole.

In the above embodiment, the partition groove can be a sit or comprise a plurality of through holes that is arranged around the pixel electrode. An example will be articulated with forming a slit as the partition groove.

Through chemical vapor deposition or other film forming methods, a passivation layer is deposited on the substrate on which the above patterns has been formed, then a photoresist layer is applied on the passivation layer, and an exposing is performed on the photoresist with a half-tone mask or a gray-tone mask, so that the photoresist layer is formed into a completely exposed region, a partially exposed region, and an un-exposed region. On the substrate, the position of the passivation layer via hole over the drain electrode and the region where the slit is formed at the pixel electrode periphery corresponds to a completely exposed region, the region where the pixel electrode is formed corresponds to a partially exposed region, and the remaining region correspond to the un-exposed region. After developing, the photoresist in the completely exposed region (i.e., photoresist completely removed region) is completely removed, the photoresist in the partially exposed region (i.e., photoresist partially remained region) is partially removed, and the photoresist in the un-exposed region (i.e., photoresist fully remained region) has the largest thickness. In this case, the applied photoresist layer has a thickness of about 2 µm or larger. The photoresist of such a thickness can have a thickness of 1 µm or larger after the subsequent ashing process.

Through a dry etching in which chemical reactions dominate, an etching is performed on the passivation layer at the position of the passivation layer via hole so as to form a passivation layer via hole on the drain electrode, and also an etching is performed on the passivation layer and the gate insulating layer at the pixel electrode periphery so as to form a slit with a width of about 1 µm~about 30 µm and have the passivation layer and the gate insulating layer in the slit be subject to a significant lateral etching. The conditions for the dry etching includes a radio frequency power (RF power) of about 1000 W~about 5000 W, a pressure of about 0.0665 mbar~about 0.399 mbar (about 50 mTorr~about 300 mTorr), in a reaction gas containing fluorine-based gas of about 10 vol. %~about 50 vol. %. These conditions for the dry etching can allow the rate at which the gate insulating layer in the slit retreats laterally much higher than that of the photoresist, so that the passivation layer and the gate insulating layer suffer from a significant lateral etching. In this case, increasing the reaction pressure and ensuring the content percentage of the fluorine-containing gas is helpful to make chemical reactions dominate in the dry etching, while decreasing the RF power can reduce the ion impact so that the etching rate is mainly dominated by the isotropic chemical reaction.

With an ashing process, the photoresist layer in the partially exposed region is completely removed, the photoresist layer in the un-exposed region is reduced in thickness but still has a thickness of about 1 µm or larger. Through the dry etching and ashing process described above, the photoresist edge on the slit has a suspended undercut.

Through magnetron sputtering, thermal evaporation or other film forming methods, a transparent conductive thin film is deposited on the substrate on which the above patterns have been formed. The transparent conductive thin film 13 can be formed of indium tin oxide (ITO), indium zinc oxide (IZO), or the like. At the slit, due to the suspended undercut at the photoresist edge, the transparent conductive thin film deposited in the slit has a small thickness, and the transparent conductive thin film at the edges of the slit is disconnected. That is, the transparent conductive thin film in the slit is not connected with the transparent conductive thin film at either side of the slit, which does not affect the integrity of the pixel electrode pattern. Furthermore, a portion of the photoresist is uncovered at the section of the edges of the slit, which provides a good basis for the subsequent lift-off process.

In the end, by removing the remaining photoresist layer with a lift-off process, the transparent conductive thin film attached to the photoresist layer is also lift-off along with the photoresist layer by chemicals, so that a pattern for the pixel electrode is formed. The pixel electrode is connected with the drain electrode via the passivation layer via hole, and only a little transparent conductive thin film remains at the bottom of the slit at the periphery of the pixel electrode.

In the embodiments described above, there is provided a TFT-LCD array substrate. The first patterning process is performed with a normal mask to form a pattern for the gate line and the gate electrode, the second patterning process is then performed with a half-tone mask or a gray-tone mask to form patterns for the data line, the source electrode, the drain electrode, and the TFT channel region, and patterns for the passivation layer via hole and the partition groove are finally formed with a half-tone mask or a gray-tone mask to form the pixel electrode. During forming the partition groove in the third patterning process in the present invention, through a dry etching in which chemical reactions dominate, the passivation layer and the gate insulating layer in the partition groove are subject to significant lateral etching, so that the photoresist edge at the partition groove forms a suspended undercut, and the transparent conductive thin film deposited subsequently is disconnected at the partition groove. That is, the transparent conductive thin film in the partition groove is disconnected from the transparent conductive thin film outside the partition groove. This not only improves the quality of the lift-off process and the integrity of the pixel electrode, but also reduces the production time and yield. The 3-Mask process according to the embodiments of the present invention can reduce production time considerably and therefore lowers the production cost.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method for manufacturing a thin film transistor liquid crystal display (TFT-LCD) array substrate comprising:
    step 1 of depositing a layer of gate metal thin film on a substrate and patterning the gate metal thin film to form a pattern including a gate line and a gate electrode;
    step 2 of depositing sequentially a gate insulating layer, a semiconductor layer, a doped semiconductor layer, and a layer of source/drain metal thin film on the substrate after step 1, and patterning the layers to form patterns including a data line, a source electrode, a drain electrode, and a thin film transistor (TFT) channel region; and
    step 3 of depositing a passivation layer on the substrate after step 2, then patterning the passivation layer with a pattern of photoresist as a mask to form patterns including a passivation layer via hole and a partition groove and retain a part of the passivation layer which is in a region where a pixel electrode pattern is to be formed, removing a part of the photoresist which is in the region where the pixel electrode pattern is to be formed and retaining the other part of the photoresist used in the patterning process for patterning the passivation layer, then depositing a transparent conductive thin film, and forming the pixel electrode pattern through a lift-off process, wherein the passivation layer via hole is located above the drain electrode, the partition groove is formed at the periphery of the pixel electrode in the passivation layer, the pixel electrode is formed on the top of the passivation layer and connected with the drain electrode via the passivation layer via hole.

2. The method for manufacturing a TFT-LCD array substrate according to claim 1, wherein the step 3 comprises:
    step 31 of depositing the passivation layer on the substrate after step 2;
    step 32 of applying a photoresist layer on the passivation layer;
    step 33 of performing exposing and developing the photoresist layer with a half-tone mask or a gray-tone mask to form a photoresist fully remained region, a photoresist partially remained region, and a photoresist completely removed region, wherein the photoresist completely removed region corresponds to regions where the passivation layer via hole and the partition groove are formed, the photoresist partially remained region corresponds to a region where the pixel electrode is formed, and the photoresist fully remained region corresponds to remaining regions on the substrate;
    step 34 of forming the passivation layer via hole and the partition groove by a dry etching and having the passivation layer and the gate insulating layer in the partition groove be subject to a lateral etching;
    step 35 of removing the photoresist layer in the photoresist partially remained region by an ashing process, wherein the photoresist edge at the position of the partition groove forms a suspended undercut;
    step 36 of depositing the transparent conductive thin film;
    step 37 of removing the photoresist layer by a lift-off process and simultaneously removing the transparent conductive thin film over the photoresist layer so that the pixel electrode pattern is formed.

3. The method for manufacturing a TFT-LCD array substrate according to claim 2, wherein the step 32 comprises:
    applying the photoresist layer with a thickness of more than 2 µm over the passivation layer.

4. The method for manufacturing a TFT-LCD array substrate according to claim 2, wherein the step 34 comprises:
    through a dry etching in which chemical reactions dominate, etching the passivation layer at the position of the passivation layer via hole to form a passivation layer via hole over the drain electrode, etching the passivation layer and the gate insulating layer at the position of the partition groove of the pixel electrode periphery to form the partition groove and making the passivation layer and the gate insulating layer in the partition groove be subject to a lateral etching.

5. The method for manufacturing a TFT-LCD array substrate according to claim 1, wherein the partition groove is a slit or comprises a plurality of through holes aligned in line.

6. The method for manufacturing a TFT-LCD array substrate according to claim 5, wherein the width of the partition groove is about 1 µm~about 30 µm.

7. The method for manufacturing a TFT-LCD array substrate according to claim 4, wherein the dry etching in which chemical reactions dominate is performed under a RF power of about 1000 W~about 5000 W and a pressure of about 0.0665 mbar~about 0.399 mbar, in a reaction gas containing fluorine-based gas of about 10 vol. %~about 50 vol. %.

* * * * *